US007973455B2

(12) United States Patent
Ota

(10) Patent No.: US 7,973,455 B2
(45) Date of Patent: Jul. 5, 2011

(54) ULTRASONIC SENSOR HAVING STABLE ANISOTROPY IN DIRECTIONAL PROPERTIES

(75) Inventor: Junshi Ota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 480 days.

(21) Appl. No.: 12/066,089

(22) PCT Filed: Aug. 29, 2006

(86) PCT No.: PCT/JP2006/316935

§ 371 (c)(1), (2), (4) Date: Jan. 12, 2009

(87) PCT Pub. No.: WO2007/029559

PCT Pub. Date: Mar. 15, 2007

(65) Prior Publication Data

US 2009/0302712 A1 Dec. 10, 2009

(30) Foreign Application Priority Data

Sep. 9, 2005 (JP) ................................ 2005-262742

(51) Int. Cl.
*H01L 41/08* (2006.01)

(52) U.S. Cl. ........ 310/348; 310/334; 310/336; 600/437; 600/459

(58) Field of Classification Search .................. 310/334, 310/336, 348; 600/437, 459
See application file for complete search history.

(56) References Cited

U.S. PATENT DOCUMENTS 5,025,790 A * 6/1991 Dias .............................. 600/459
5,446,332 A * 8/1995 Rapps et al. .................. 310/324
5,612,930 A * 3/1997 Hazony et al. ................ 367/140
6,250,162 B1 * 6/2001 Amaike et al. .................. 73/642
6,520,019 B1 * 2/2003 Schon et al. ..................... 73/632
6,522,032 B1 * 2/2003 Karnowka et al. ............ 307/119
6,876,127 B2 * 4/2005 Mitsuoka et al. ............. 310/324
7,392,705 B2 * 7/2008 Kawashima et al. ........... 73/632
7,545,082 B2 * 6/2009 Nakajima ...................... 310/334
7,548,014 B2 * 6/2009 Asada et al. ................... 310/348
7,728,486 B2 * 6/2010 Matsuo ......................... 310/322
7,732,993 B2 * 6/2010 Ota .............................. 310/336

(Continued)

FOREIGN PATENT DOCUMENTS

DE 101 23 612 A1 11/2001

(Continued)

OTHER PUBLICATIONS

Official communication issued in counterpart International Application No. PCT/JP2006/316935, mailed on Dec. 12, 2006.

(Continued)

*Primary Examiner* — J. SanMartin
(74) *Attorney, Agent, or Firm* — Keating & Bennett, LLP

(57) ABSTRACT

A case member of an ultrasonic sensor includes an outer case member having a substantially cylindrical shape with a bottom surface and an inner case member. Cutout portions having a predetermined size are arranged so as to face each other in a lower portion of a sidewall of the inner case member. The inner case member is made of a metal material having a density that is greater than that of the outer case member. Consequently, an elliptical vibrating-surface amplitude profile can be formed in a vibrating surface of the ultrasonic sensor, and an ultrasonic sensor having stable anisotropy in directional properties can be provided. Further, the ultrasonic sensor has a small amount of displacement of side vibration.

6 Claims, 8 Drawing Sheets

U.S. PATENT DOCUMENTS

| | | | | |
|---|---|---|---|---|
| 2002/0021056 | A1 | 2/2002 | Amaike et al. | |
| 2003/0121331 | A1 * | 7/2003 | Mitsuoka et al. | 73/632 |
| 2006/0044455 | A1 * | 3/2006 | Kim et al. | 348/360 |

FOREIGN PATENT DOCUMENTS

| | | | |
|---|---|---|---|
| EP | 1 962 552 | A1 | 8/2008 |
| JP | 2001-078296 | A | 3/2001 |

OTHER PUBLICATIONS

Official Communication issued in corresponding European Patent Application No. 06796915.4, mailed on Jun. 10, 2010.

The official communication issued in counterpart International Application No. PCT/JP2006/316935, mailed on Dec. 12, 2006.

* cited by examiner

ULTRASONIC SENSOR HAVING STABLE ANISOTROPY IN DIRECTIONAL PROPERTIES

BACKGROUND OF THE INVENTION

1. Field of the Invention

The present invention relates to ultrasonic sensors, and more particularly, to an ultrasonic sensor used, for example, for a back-up sensor for an automobile.

2. Description of the Related Art

An ultrasonic sensor of the related art used for back-up sensors of automobiles is attached to a bumper or other suitable structure of the automobiles, and is used as an obstacle detection sensor, such as a back-up sensor or a corner sensor. The ultrasonic sensor is attached to the bumper such that a bottom portion of a case member having a piezoelectric element fixed thereto is substantially perpendicular to a road surface and the ultrasonic sensor is located and adjusted in a direction in which ultrasonic waves are emitted. In an ultrasonic sensor used for such an application, if the range of ultrasonic wave transmission and reception in a horizontal installation direction is too narrow, a dead angle occurs in the detection range. If the range of ultrasonic wave transmission and reception in a vertical direction is too broad, a reflection of waves from the ground surface causes noise. Therefore, anisotropy in directional properties in the horizontal and vertical installation directions is required.

FIGS. 9A to 9C include schematic diagrams showing an example of a case member 1 used for an ultrasonic sensor as described above. FIG. 9A is a cross-sectional plan view of the case member 1, FIG. 9B is a cross-sectional view taken along a line B-B (in a vertical installation direction) shown in FIG. 9A, and FIG. 9C is a cross-sectional view taken along a line C-C (in a horizontal installation direction) shown in FIG. 9A. The case member 1 is composed entirely of a metal material, such as aluminum, and is provided with a hollow portion 3 which is open toward the rear. A bottom portion 2 of the case member 1 includes a thick portion 2*a* at the center thereof in the vertical installation direction, and substantially crescent-shaped thin portions 2*b* at both sides thereof. One electrode surface of a piezoelectric element 5 is bonded to an inner surface of the thick portion 2*a* at the center of the bottom portion 2 by an electrically conductive adhesive or other suitable adhesive. In the cross section in the vertical installation direction, therefore, as shown in FIG. 9B, the thin portions 2*b* are located at either side of the thick portion 2*a* having the piezoelectric element 5 mounted thereon. In the cross section in the horizontal installation direction passing through the center of the case member 1, as shown in FIG. 9C, the entire bottom portion 2 is defined by the thick portion 2*a*. The thick portion 2*a* has a thickness greater than a minimum thickness of an outer peripheral sidewall portion 4 of the case member 1, and the thin portions 2*b* have a thickness less than the minimum thickness of the outer peripheral sidewall portion 4 of the case member 1.

The ultrasonic sensor having the structure described above narrows the transmission and reception range in the vertical installation direction (the direction in which the width of the hollow portion 3 extends). Since there is a difference between the transmission and reception range in the horizontal installation direction and the transmission and reception range in the vertical installation direction, an ultrasonic sensor having anisotropy in directional properties is obtained (see, for example, Japanese Unexamined Patent Application Publication No. 2000-32594).

However, the sidewall of the case member 1 in the ultrasonic sensor described in Japanese Unexamined Patent Application Publication No. 2000-32594 is provided with a thick portion and thin portions to achieve desired directional properties, and the case member 1 with such a complex structure is manufactured by processing aluminum, such as forging, cutting, and die casting (high-pressure casting). Due to the complexity of the structure, the manufacturing cost is high.

Another problem is as follows. It is preferable that the surface of the case member 1 to which the piezoelectric element is adhered has a structure that ensures a sufficient degree of vibration. In particular, it is preferable that a portion (corner/edge) defined between the bottom surface and sidewall of the case member 1 vibrates. However, in the ultrasonic sensor of Japanese Unexamined Patent Application Publication No. 2000-32594, the case member 1 is provided with a thick portion and thin portions, and the vibration in the vicinity of the thick portion is suppressed. It is therefore difficult to achieve significant anisotropy.

Still another problem is as follows. The case member 1 in the ultrasonic sensor of Japanese Unexamined Patent Application Publication No. 2000-32594 is designed such that the hollow portion of the case member 1 has an elliptical cross section in order to ensure anisotropy in directional properties. The case member 1 formed into an elliptical shape has a thin sidewall portion, and the amplitude of side vibration is relatively large at that portion. As a result, for example, if the ultrasonic sensor is mounted in an automobile, characteristics of the ultrasonic sensor are likely to change when a rubber cushion and a housing are secured to the automobile. Therefore, it is difficult to ensure desired characteristics.

SUMMARY OF THE INVENTION

To overcome the problems described above, preferred embodiments of the present invention provide an ultrasonic sensor having stable anisotropy in directional properties.

An ultrasonic sensor according to a preferred embodiment of the present invention includes a case member having a substantially cylindrical shape with a bottom, and a piezoelectric element provided on an inner surface side of the bottom of the case member, wherein cutouts are provided in a portion contacting the bottom on an inner surface side of a sidewall of the case member.

In the ultrasonic sensor, the cutouts are preferably arranged so as to face each other in the portion contacting the bottom on the inner surface side of the sidewall of the case member.

In this manner, the cutouts are arranged so as to face each other in the portion contacting the bottom portion on the inner surface side of the sidewall of the case member, whereby an elliptical vibrating surface is obtained, and the amplitude in the vibrating surface is increased.

Preferably, the case member used for the ultrasonic sensor according to preferred embodiments of the present invention includes an outer case member and an inner case member provided inside the outer case member, and the cutouts are provided in the inner case member.

In this manner, the case members of the ultrasonic sensor are separately formed with a simple structure and are combined. Thus, an ultrasonic sensor having outstanding anisotropy in directional properties is achieved. Further, each of the components has a simple structure, and therefore can be manufactured at low cost.

Furthermore, in the ultrasonic sensor according to preferred embodiments of the present invention, the inner case member is preferably made of a metal material having a density that is greater than that of the outer case member.

Since the inner case member is made of a metal material having a density that is greater than that of the outer case member, an ultrasonic sensor having small changes in side vibration of the case members is provided.

According to preferred embodiments of the present invention, a case member of an ultrasonic sensor in which cutouts are formed so as to face each other in a portion contacting a bottom on an inner surface side of a sidewall of the case member is provided, whereby a vibrating surface of the ultrasonic sensor in which an elliptical vibrating-surface amplitude profile is provided is obtained. Therefore, an ultrasonic sensor having outstanding anisotropy of directional properties in horizontal and vertical installation directions is provided.

Further, since the inner case member of the ultrasonic sensor is made of a metal material having a density greater than that of the outer case member, side vibration in the ultrasonic sensor is significantly reduced. Therefore, an ultrasonic sensor which has only small changes in characteristics of the ultrasonic sensor when the ultrasonic sensor is installed is obtained.

Further, since the case member of the ultrasonic sensor according to preferred embodiments of the present invention has a simple structure, a case member which is easy to manufacture is provided.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1A:
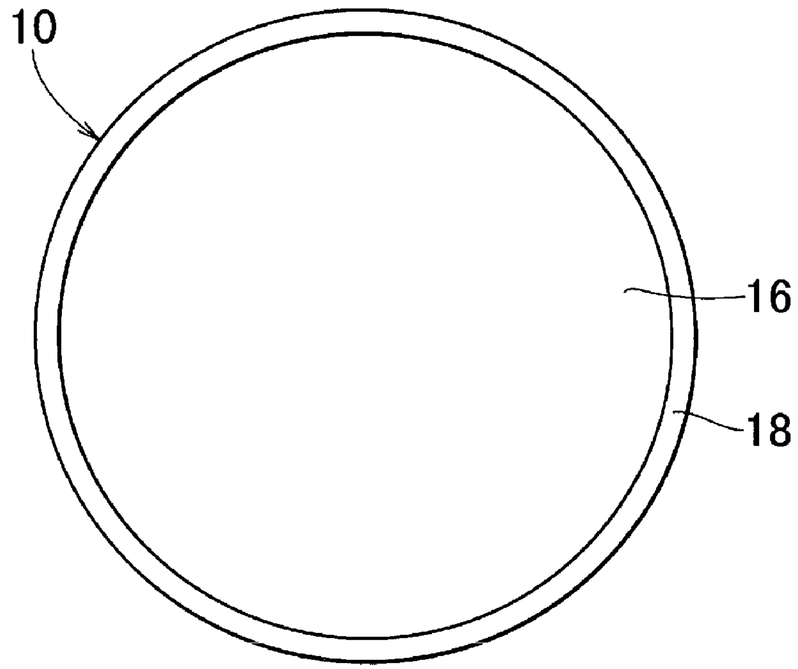
FIG. 1A is a plan view of an outer case member of an ultrasonic sensor according to a preferred embodiment of the present invention.
Figure 1B:
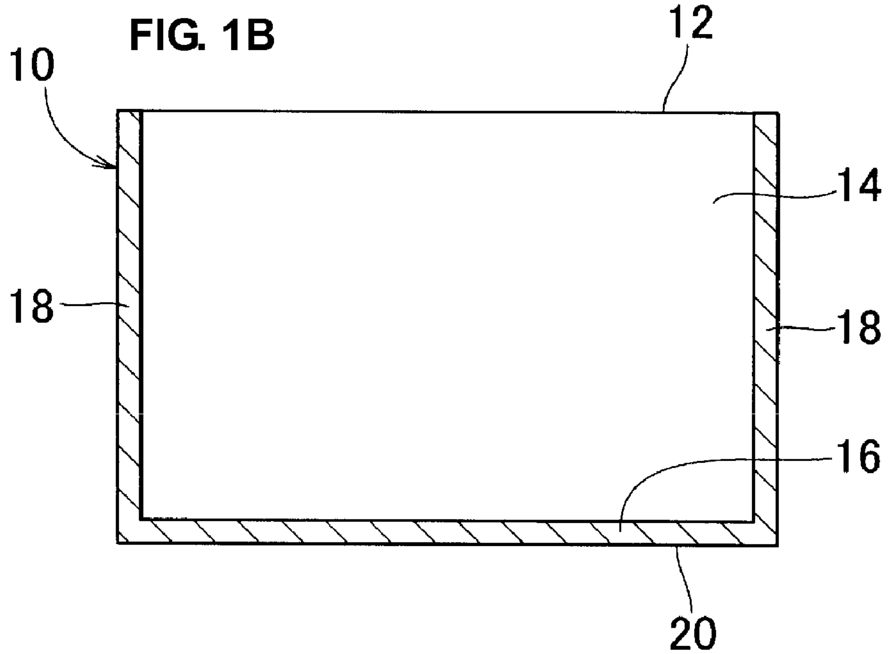
FIG. 1B is a cross-sectional view thereof.
Figure 2A:
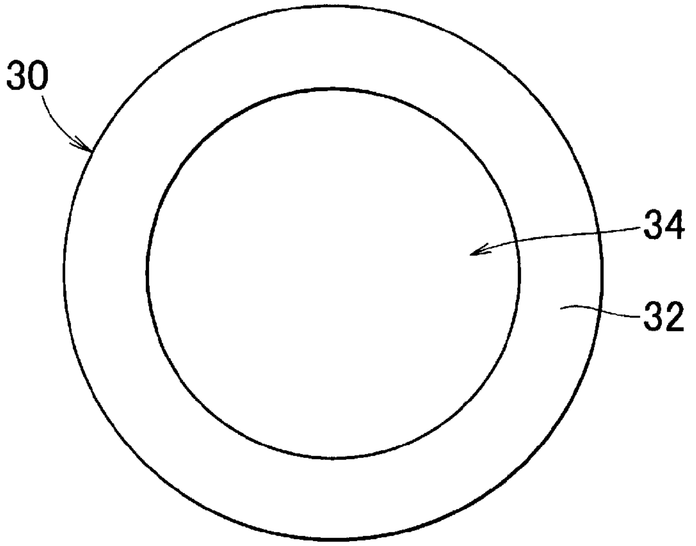
FIG. 2A is a top plan view of an inner case member of the ultrasonic sensor according to this preferred embodiment of the present invention.
Figure 2B:
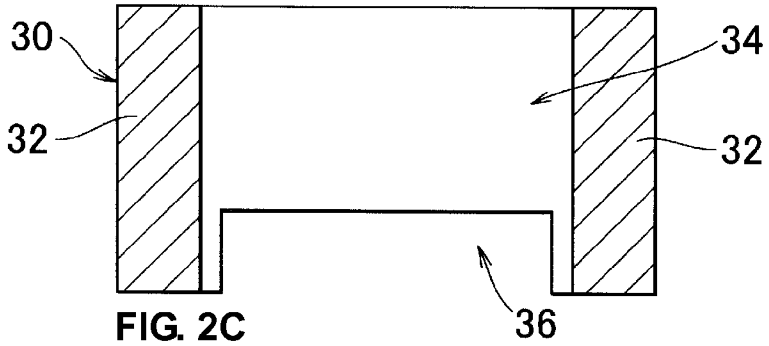
FIG. 2B is a cross-sectional view thereof.
Figure 2C:
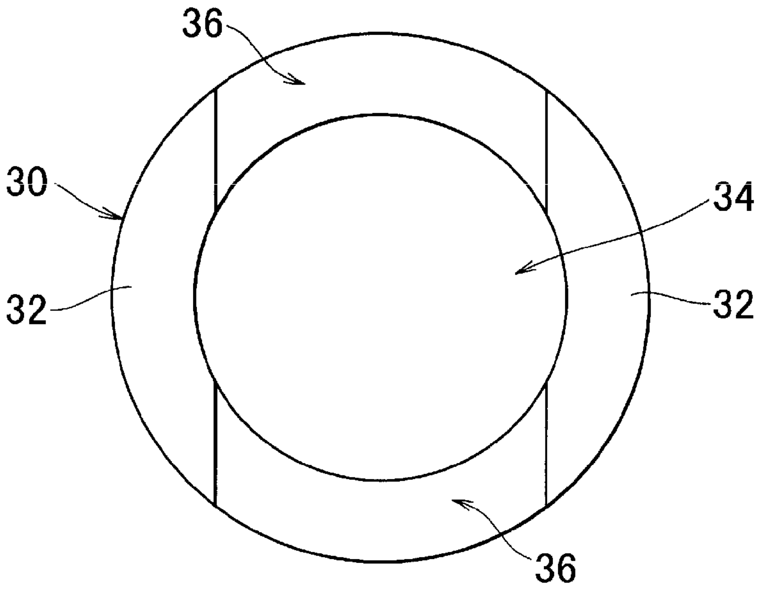
FIG. 2C is a bottom plan view thereof.
Figure 3A:
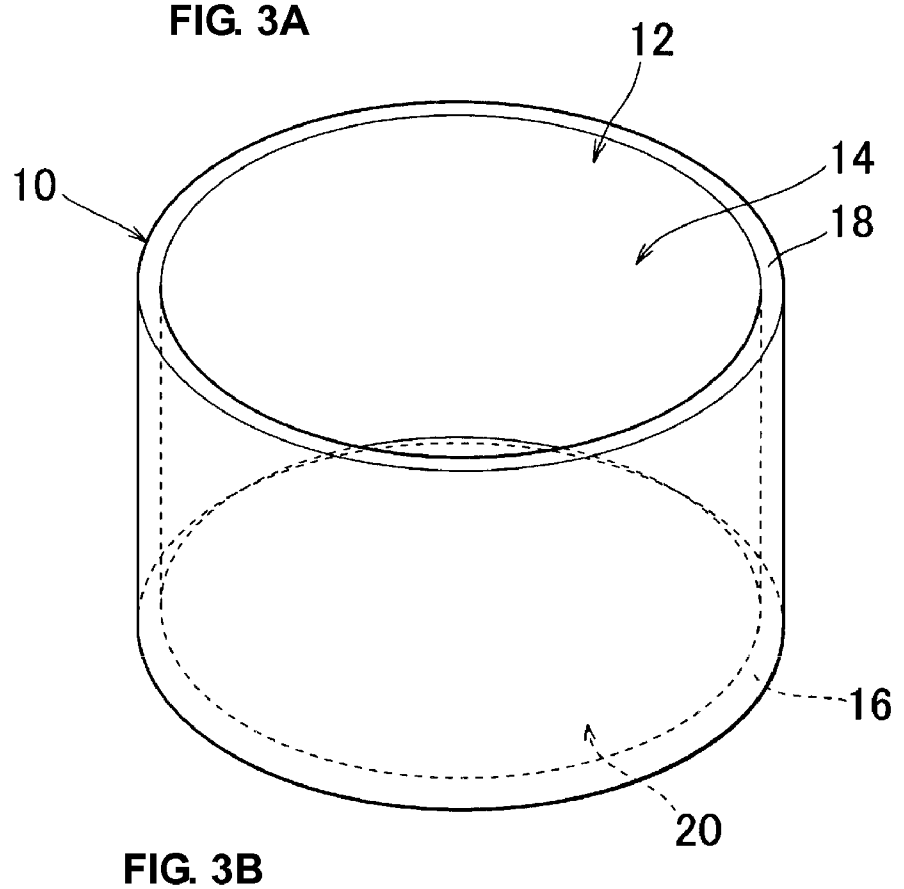
FIG. 3A is a perspective view of the outer case member according to this preferred embodiment of the present invention.
Figure 3B:
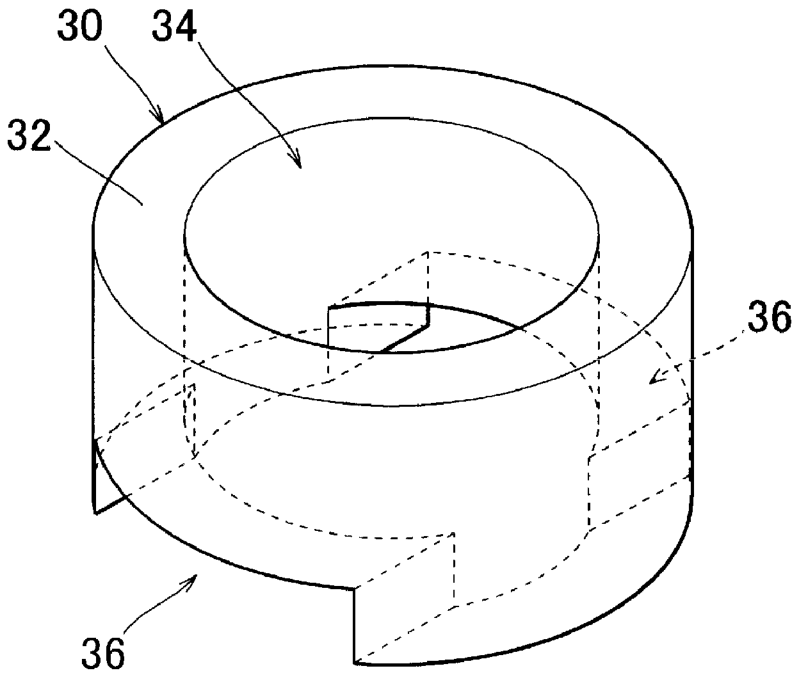
FIG. 3B is a perspective view of the inner case member according to a preferred embodiment of the present invention.

FIGS. 1A and 1B, FIGS. 2A to 2C, and FIGS. 3A and 3B show an ultrasonic sensor according to a preferred embodiment of the present invention. FIGS. 1A and 1B and FIGS. 2A to 2C show an outer case member 10 and an inner case member 30 used in the ultrasonic sensor of the present preferred embodiment. FIG. 1A is a plan view of the outer case member 10, and FIG. 1B is a cross-sectional view thereof. FIG. 2A is a top plan view of the inner case member 30, FIG. 2B is a cross-sectional view thereof, and FIG. 2C is a bottom plan view thereof. FIGS. 3A and 3B are perspective views of the outer case member 10 and inner case member 30 of the ultrasonic sensor according to the present preferred embodiment of the present invention. The ultrasonic sensor includes the outer case member 10 having, for example, a substantially cylindrical shape with a bottom and the inner case member 30 having a substantially cylindrical shape.

The outer case member 10 is provided with an opening portion 12 and a hollow portion 14, and further includes a bottom surface portion 16 and a sidewall 18. A vibrating surface 20 is located in an outer surface of the bottom surface portion 16. A piezoelectric element is mounted on an inner surface of the bottom surface portion 16 of the outer case member 10.

The outer case member 10 is made of a metal material, such as aluminum.

The outer case member 10 has, for example, an overall height of about 9 mm, an outer diameter of about 14 mm, and an inner diameter of about 13 mm. The bottom surface portion 16 of the outer case member 10 has a uniform thickness of about 0.5 mm, and the sidewall 18 of the outer case member 10 has a uniform thickness of about 0.5 mm.

The outer case member 10 is manufactured by, for example, pressing a plate subjected to surface treatment and painting.

The inner case member 30 is configured to provide stable anisotropy in directional properties of the ultrasonic sensor. The inner case member 30 is located in the hollow portion 14 of the outer case member 10. The inner case member 30 has a tubular shape having a hollow portion 34. Two cutout portions 36 are arranged so as to face each other in a lower portion of the sidewall 32 of the inner case member 30.

The inner case member 30 is made of a metal material such as zinc. Preferably, the metal material used for the inner case member 30 has a density that is greater than that used for the outer case member 10.

The inner case member 30 has, for example, an overall height of about 7 mm, an outer diameter of about 13 mm, and an inner diameter of about 9 mm. The sidewall 32 of the inner case member 30 has a thickness of about 2 mm. The cutout portions 36 have, for example, a cutout width of about 8 mm and a cutout depth of about 2 mm.

The inner case member 30 located in the hollow portion 14 of the outer case member 10 produces a portion at which the inner case member 30 is not in contact with the vibrating surface 20. Thus, a vibration with an elliptical amplitude profile occurs in the vibrating surface 20. Consequently, stable anisotropy in directional properties of the ultrasonic sensor is obtained.

Figure 4A:
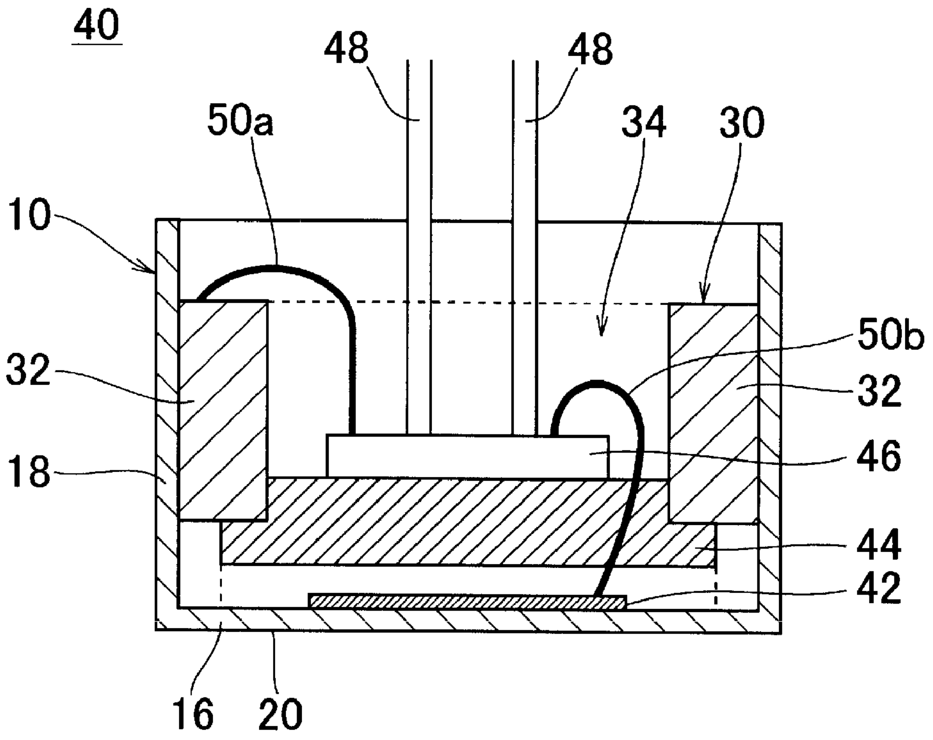
FIG. 4A is a cross-sectional view in a vertical installation direction of the ultrasonic sensor according to this preferred embodiment of the present invention.
Figure 4B:
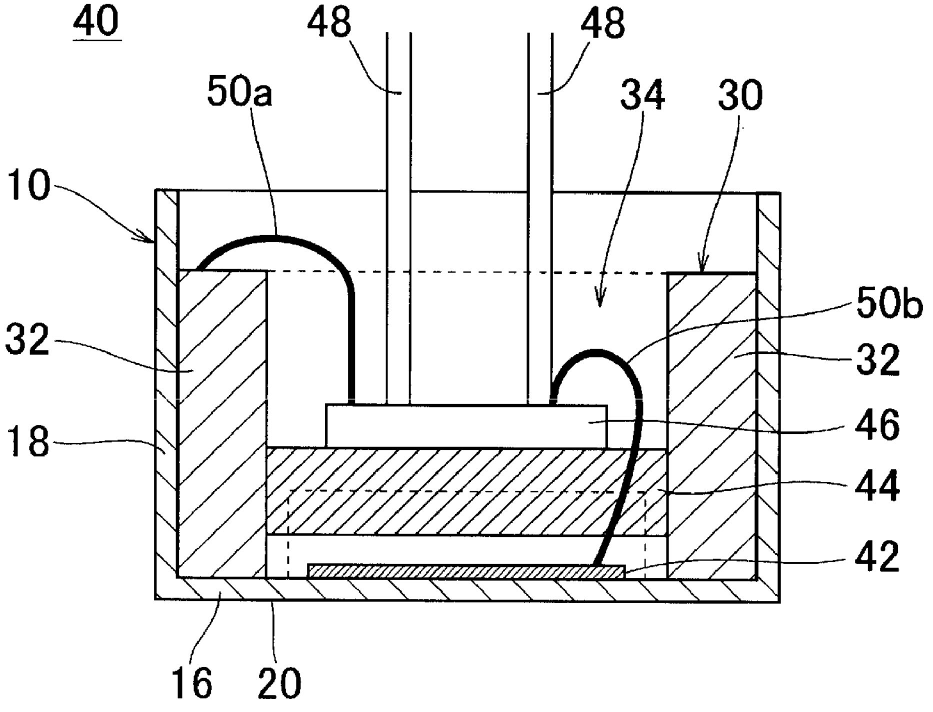
FIG. 4B is a cross-sectional view in a horizontal installation direction thereof.

FIGS. 4A and 4B include cross-sectional views of an ultrasonic sensor 40 including the outer case member 10 and the inner case member 30 according to this preferred embodiment of the present invention. FIG. 4A is a cross-sectional view in the vertical installation direction, and FIG. 4B is a cross-sectional view in the horizontal installation direction.

A piezoelectric element 42 is mounted on an inner surface of the bottom surface portion 16 of the outer case member 10. A sound-absorbing member 44 is located in the hollow portion 34 of the inner case member 30, and a substrate 46 is provided on a top surface of the sound-absorbing member 44. The substrate 46 is connected to cables 48.

The substrate 46 is connected to the inner case member 30 through a wire 50*a*, and is electrically connected to an electrode on one surface of the piezoelectric element 42 through the inner case member 30 and the outer case member 10. The substrate 46 and an electrode on an opposite surface of the piezoelectric element 42 are electrically connected though a wire 50*b*.

A driving voltage having a frequency equal to a natural frequency of an ultrasonic sensor including the outer case member 10 and the inner case member 30 is applied to the piezoelectric element 42 to excite the piezoelectric element 42 to cause vibration of the vibrating surface 20. Thus, an ultrasonic wave is transmitted. Receipt of an acoustic wave at the vibrating surface 20 causes natural vibration of the vibrating surface 20, and an electrical signal is obtained.

In the ultrasonic sensor, since the cutout portions 36 are arranged so as to face each other in the sidewall 32 of the inner case member 30, an elliptical vibration profile is formed in the vibrating surface 20 of the outer case member 10. Thus, stable anisotropy in directional properties in the horizontal and vertical installation directions is achieved.

Further, the inner case member 30 is made of a metal material having a density that is greater than that of the outer case member 10, whereby the amount of displacement of side vibration of the sidewall 18 of the outer case member 10 is reduced. Therefore, small changes in characteristics of the ultrasonic sensor are obtained when the ultrasonic sensor is mounted in an automobile or other suitable vehicle.

Furthermore, each of the case members of the ultrasonic sensor has a simple structure instead of a complex structure as in the ultrasonic sensor of the related art. Therefore, the case members are easily manufactured.

Experimental Example 1

FIG. 5 shows results of a numerical calculation of the magnitude of displacement of side vibration of an X side surface and a Y side surface of each inner case member of products produced by changing the material of the inner case member 30 where the outer case member 10 shown in FIG. 1 and the inner case member 30 shown in FIG. 2 were used as case members. The abscissa represents the coordinate of a vibrating side surface, and the ordinate represents the amount of displacement of side vibration. The numerical calculation was performed using a finite element method. The finite element method is advantageous for performing numerical calculations even on objects having complex shapes, irrespective of the shape of the objects. The X side surface refers to, as shown in FIG. 6, a side surface located as an extension in a minor-axis direction of an elliptical range of vibration 22 formed on the vibrating surface 20, and the Y side surface refers to a side surface located as an extension in a major-axis direction of the elliptical range of vibration 22 formed on the vibrating surface 20. In the range of vibration 22, amplitudes increase as the shading gets darker.

For the purpose of comparison, a result of a numerical calculation of the magnitude of displacement of side vibration in a case member 1*a* of a known ultrasonic sensor is also shown. The case member 1*a* of the known ultrasonic sensor was manufactured to have the shape shown in FIG. 7.

Figure 7:
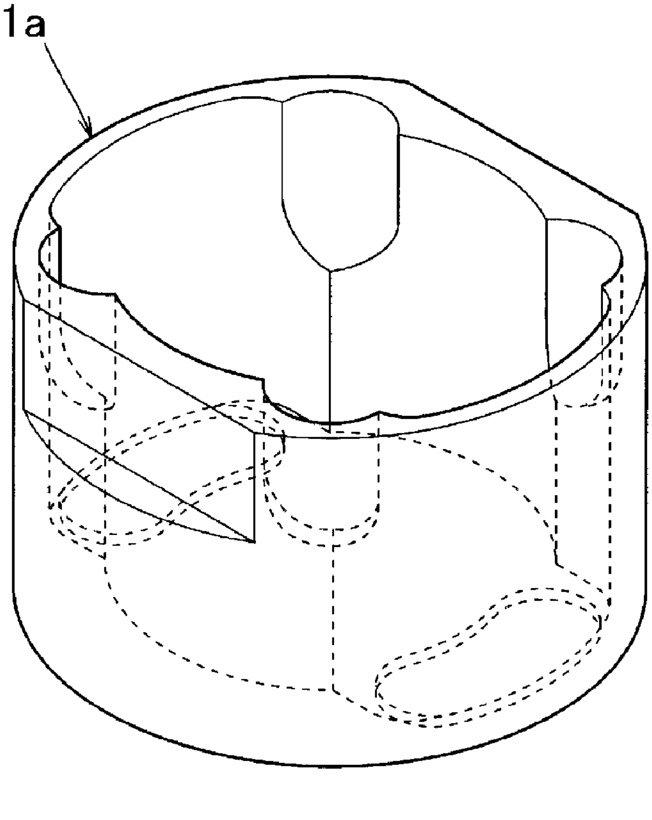
FIG. 7 is a perspective view showing an existing case member of an ultrasonic sensor.

The current numerical calculation was performed using aluminum as the metal material of the existing product shown in FIG. 7 and using aluminum, zinc, and tungsten as metal materials of the inner case member 30 according to this preferred embodiment of the present invention. Aluminum was used as the metal material of the outer case member 10.

Figure 5A:
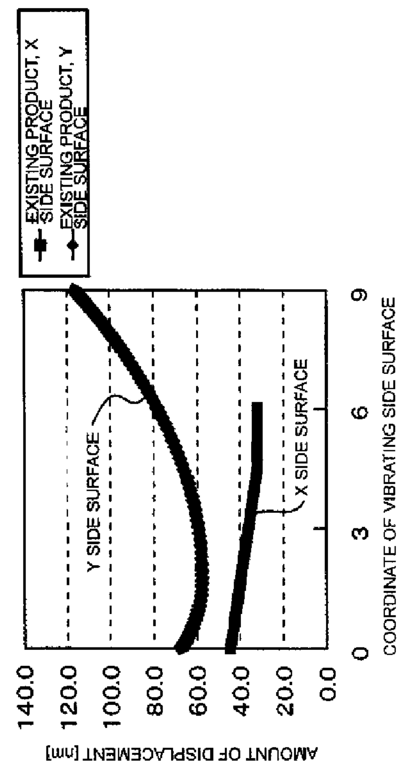
FIGS. 5A to 5D include diagrams showing the magnitude of displacement of side vibration of an X side surface and a Y side surface of the ultrasonic sensor according to this preferred embodiment of the present invention.
Figure 5B:
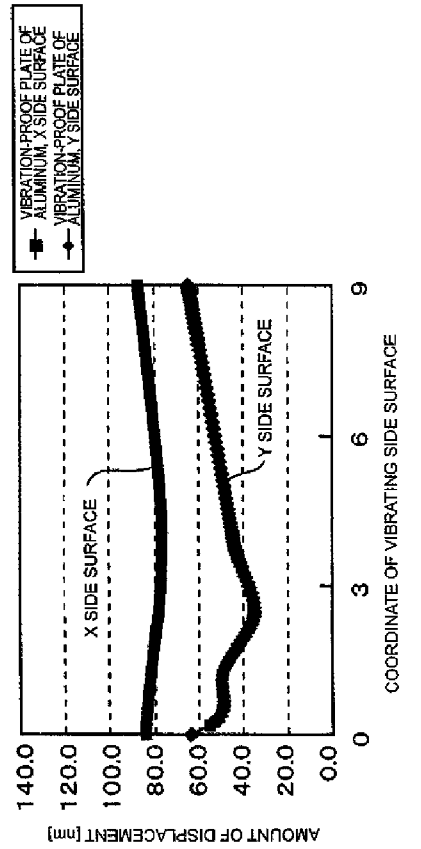
Figure 5C:
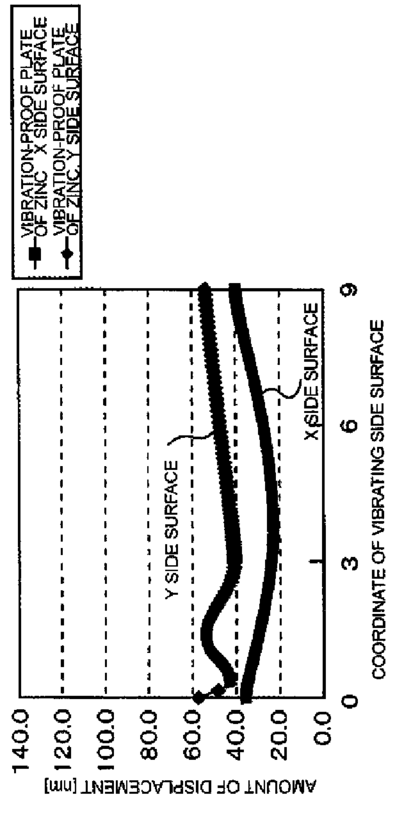
Figure 5D:
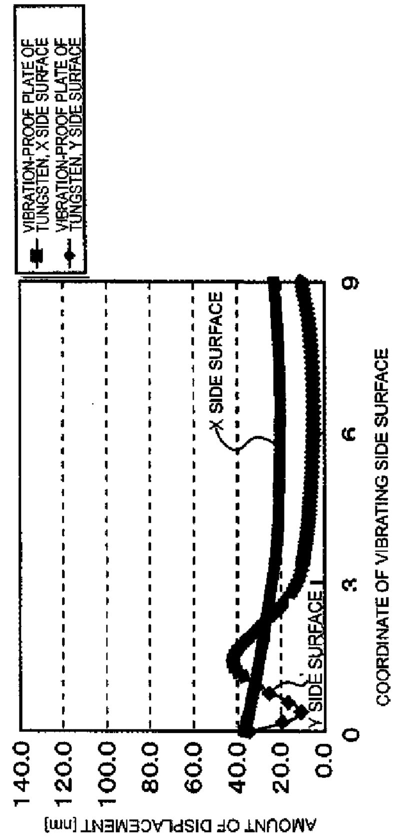
Figure 6:
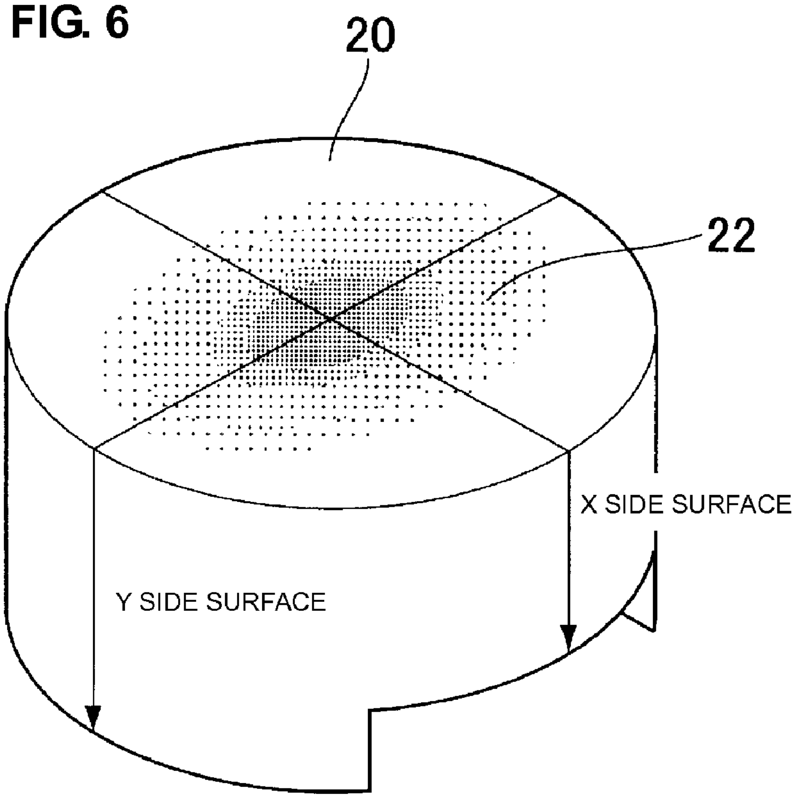
FIG. 6 is a diagram showing locations of the X side surface and Y side surface of the ultrasonic sensor according to this preferred embodiment of the present invention.

FIG. 5A shows a result obtained by the known product, FIG. 5B shows a result obtained using aluminum as the metal material of the inner case member 30, FIG. 5C shows a result obtained using zinc as the metal material of the inner case member 30, and FIG. 5D shows a result obtained using tungsten as the metal material of the inner case member 30.

The magnitude of displacement of side vibration of the known product was about 40.0 nm on the X side surface and was at least about 60.0 nm on the Y side surface.

The magnitude of displacement of side vibration obtained using aluminum as the material of the inner case member 30, which is the same as the material of the outer case member 10, was about 80.0 nm on the X side surface and was about 40.0 nm to about 60.0 nm on the Y side surface.

The magnitude of displacement of side vibration obtained using zinc as the material of the inner case member 30, which had a greater density than that of the outer case member 10, was about 20.0 nm to about 40.0 nm on the X side surface and was about 40.0 nm to about 60.0 nm on the Y side surface.

The magnitude of displacement of side vibration obtained using tungsten as the material of the inner case member 30, which had a greater density than that of the outer case member 10, was about 20.0 nm to about 40.0 nm on the X side surface and was about 10.0 nm to about 40.0 nm on the Y side surface.

As illustrated by the above results, when the known product and the product in which aluminum is used as the material of the inner case member 30 are compared to the products in which zinc and tungsten are used as the materials of the inner case member 30, the amount of displacement of side vibration of the X side surface and Y side surface of each case member was suppressed to a greater extent when zinc and tungsten were used. That is, it was confirmed that the magnitude of displacement of side vibration was suppressed by using, as the metal material of the inner case member 30, a metal material having a density that is greater than that of the metal material used for the outer case member 10.

It was also confirmed that as the difference between the density of the outer case member 10 and the density of the inner case member 30 increases, the magnitude of displacement of side vibration was further suppressed.

Experimental Example 2

Results of numerical calculations were obtained when the inner diameter of the inner case member 30 and the cutout width and cutout depth of the cutout portions 36 were changed. The numerical calculation was also performed using a finite element method (FEM), as in Experimental Example 1. The results obtained for various cutout widths and cutout depths and other conditions are shown in Table 1.

TABLE 1

| | Outer Diameter [mm] | Inner Diameter [mm] | Cutout Width [mm] | Cutout Depth [mm] | Resonant Frequency [kHz] |
|---|---|---|---|---|---|
| Model 1 | 13 | 10 | 7 | 2 | 37.8 |
| Model 2 | 13 | 9 | 7 | 2 | 44.7 |
| Model 3 | 13 | 9 | 8 | 2 | 40.7 |
| Model 4 | 13 | 9 | 6 | 2 | 46.3 |
| Model 5 | 13 | 9 | 8 | 1 | 40.8 |

Currently mass-produced ultrasonic sensors are ultrasonic sensors having a resonant frequency of about 40 kHz. That is, conventionally used ultrasonic sensors have been designed so that a vibrating surface thereof has a natural vibration at about 40 kHz, and a signal that is electrically close thereto in terms of frequency is applied to excite the natural vibration. It is important that a case member used for the ultrasonic sensors has a natural vibration at about 40 kHz. As shown in Table 1, models 3 and 5 have a resonant frequency of about 40 kHz, and it can therefore be confirmed that they can be suitably used.

It was further confirmed that models 3 and 5 had an elliptically-shaped vibrating surface (not shown) and that the other models had a rhomboid-shaped vibrating surface (not shown). The rhombic shape could not provide stable vibration of the vibrating surface and could not provide sufficient anisotropy in directional properties. Models 3 and 5, on the other hand, which provide stable vibration in an elliptical manner by normal excitation, could achieve sufficient anisotropy in directional properties as ultrasonic sensors.

Figure 8:
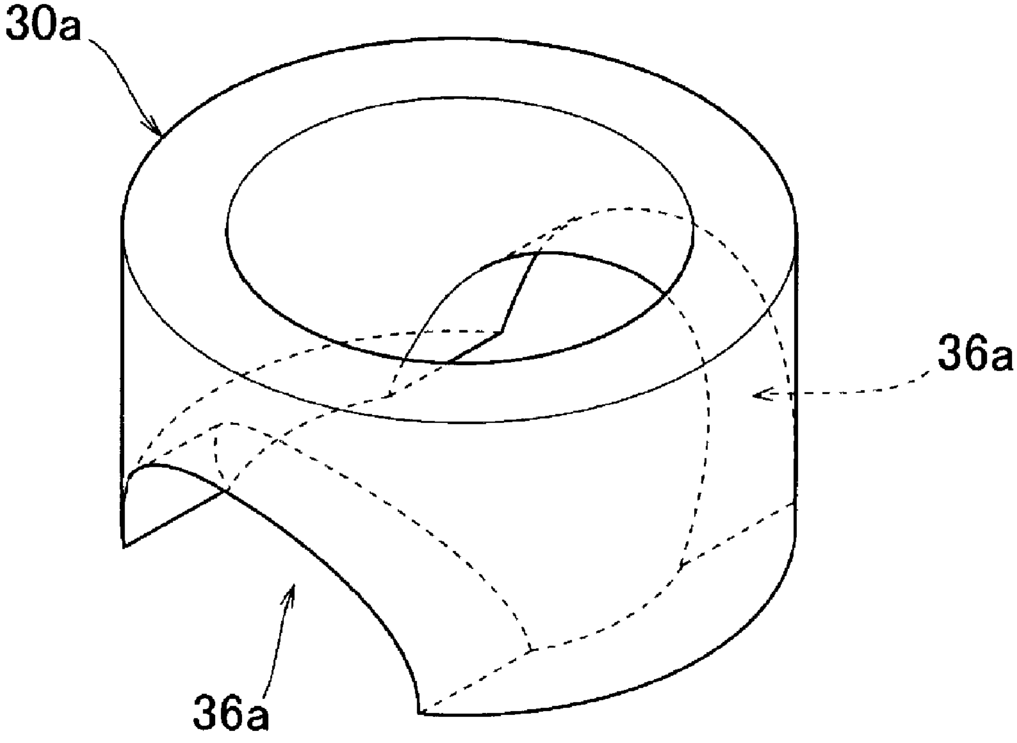
FIG. 8 is a perspective view showing another preferred embodiment of the inner case member of the ultrasonic sensor according to the present invention.
Figure 9A:
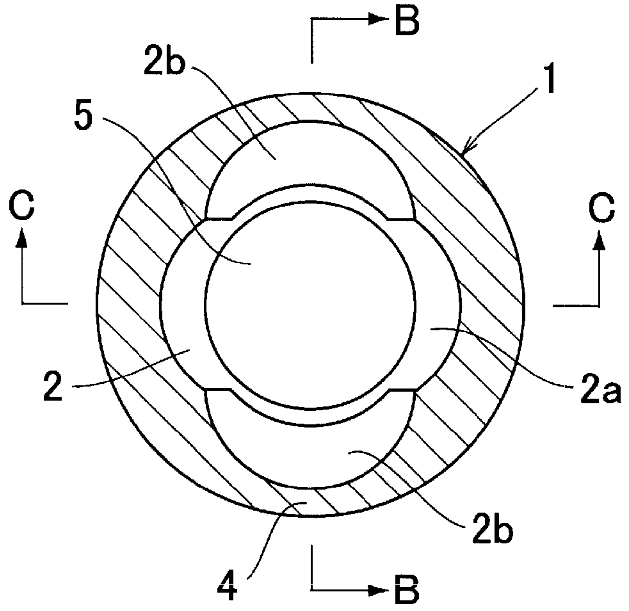
FIG. 9A PRIOR ART
FIG. 9A is a cross-sectional plan view showing a case member according to an example of an ultrasonic sensor of the related art.
Figure 9B:
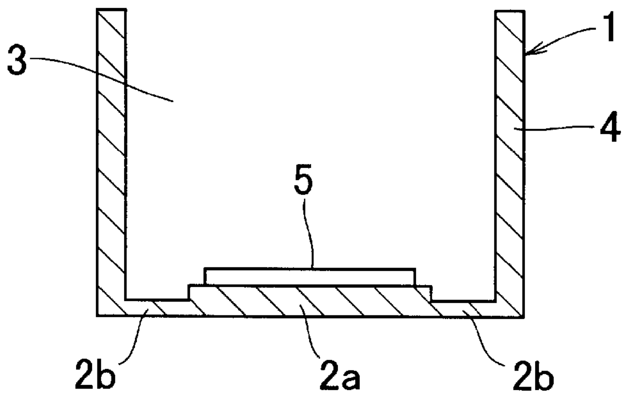
FIG. 9B PRIOR ART
FIG. 9B is a cross-sectional view taken along a line B-B shown in FIG. 9A.
Figure 9C:
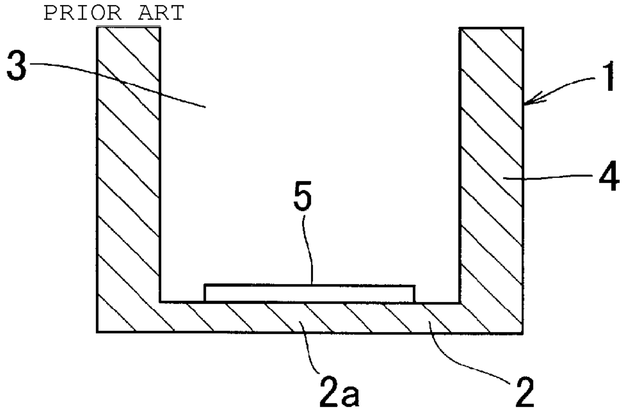
FIG. 9C PRIOR ART
FIG. 9C is a cross-sectional view taken along a line C-C shown in FIG. 9A.

In the foregoing preferred embodiments, the cutout portions 36 of the inner case member 30 preferably have a substantially rectangular shape. However, the present invention is not limited thereto, and substantially convex semicircular profiles such as cutout portions 36*a* in an inner case member 30*a* shown in FIG. 8 may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An ultrasonic sensor comprising:

a case member having a substantially cylindrical shape, the case member including an outer case member with a bottom surface and an inner case member provided inside the outer case member, a piezoelectric element provided on an inner surface side of the bottom surface of the case member; wherein cutouts are provided in the inner case member in a portion contacting the bottom surface on an inner surface side of a sidewall of the case member.

2. The ultrasonic sensor according to claim 1, wherein the cutouts are arranged so as to face each other in the portion contacting the bottom surface on the inner surface side of the sidewall of the case member.

3. The ultrasonic sensor according to claim 1, wherein the inner case member is made of a metal material having a density that is greater than that of the outer case member.

4. The ultrasonic sensor according to claim 1, wherein the outer case member is made of aluminum and the inner case member is made of one of zinc and tungsten.

5. The ultrasonic sensor according to claim 1, wherein each of the cutouts has a substantially rectangular shape.

6. The ultrasonic sensor according to claim 1, wherein each of the cutouts has a substantially convex semicircular shape.

* * * * *